United States Patent
Iijima

(10) Patent No.: US 8,585,168 B2
(45) Date of Patent: Nov. 19, 2013

(54) DISCHARGE ENERGY RECOVERY DEVICE AND IMAGE FORMING APPARATUS USING SAME

(75) Inventor: Hideaki Iijima, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 107 days.

(21) Appl. No.: 13/301,846

(22) Filed: Nov. 22, 2011

(65) Prior Publication Data

US 2012/0133693 A1 May 31, 2012

(30) Foreign Application Priority Data

Nov. 26, 2010 (JP) .................................. 2010-264230

(51) Int. Cl.
*B41J 29/38* (2006.01)
*H01L 41/107* (2006.01)

(52) U.S. Cl.
USPC .............................. 347/10; 310/316.03; 347/9

(58) Field of Classification Search
USPC ........................ 347/5–20, 75–78; 310/316.03
IPC ................................. B41J 29/38; H01L 41/107
See application file for complete search history.

(56) References Cited

U.S. PATENT DOCUMENTS 5,691,592 A * 11/1997 Gunderson et al. ............ 310/317
6,276,772 B1 * 8/2001 Sakata et al. .................... 347/10
2003/0142155 A1 * 7/2003 Umeda ............................ 347/9
2004/0113959 A1 * 6/2004 Tamura ............................ 347/9
2010/0102882 A1 * 4/2010 Yoshino et al. ............... 330/251

FOREIGN PATENT DOCUMENTS

| JP | 2002103603 A | 4/2002 |
| JP | 2002-273874 A | 9/2002 |
| JP | 2004-291405 A | 10/2004 |
| JP | 2009292077 A | 12/2009 |

* cited by examiner

*Primary Examiner* — Manish S Shah
*Assistant Examiner* — Roger W Pisha, II
(74) *Attorney, Agent, or Firm* — Harness, Dickey & Pierce, P.L.C.

(57) ABSTRACT

A discharge energy recovery device to recover discharge energy discharged from a piezoelectric element when the piezoelectric element is driven includes a drive voltage generator to generate a voltage to drive the piezoelectric element; a discharge voltage monitoring unit to monitor a voltage discharged from the piezoelectric element when the piezoelectric element is driven; a first current supplier to supply a current energy to operate a first load circuit when the discharged voltage is equal to or greater than a first voltage that enables driving of the first load circuit, and a second current supplier to supply a current energy to operate a second load circuit when the discharged voltage is less than the first voltage and equal to or greater than a second voltage that enables driving of the second load circuit by monitoring the currently discharged voltage using the discharge voltage monitoring unit.

7 Claims, 8 Drawing Sheets

DISCHARGE ENERGY RECOVERY DEVICE AND IMAGE FORMING APPARATUS USING SAME

CROSS-REFERENCE TO RELATED APPLICATION

This application claims priority to Japanese Patent Application No. 2010-264230, filed on Nov. 26, 2010 in the Japan Patent Office, which is incorporated by reference herein in its entirety.

BACKGROUND OF THE INVENTION

1. Field of the Invention

The present invention relates to a discharge energy recovery device and an image forming apparatus employing the discharge energy recovery device.

2. Description of the Background Art

Some image forming apparatuses print images on recording media by jetting ink droplets, in which a piezoelectric element (hereinafter, also referred to as an actuator) is driven when supplied with a given voltage and a large number of piezoelectric elements are driven to form an image. As shown in FIG. 1, current amplification of actuator drive voltage waveform is typically conducted using a bipolar transistor. FIG. 1 shows a typical circuit diagram of a piezoelectric element drive circuit.

In the configuration shown in FIG. 1, base terminals of bipolar transistors Q83 and Q84 constituting a current amplification unit 82 become low ("L") and an analog switch (SW) 86 is switched ON by a control signal from a recording head controller 81, at which time a voltage +VDD is applied to an actuator 85 actuator charging current A flows to the actuator 85, and a voltage Vcom which is a charged voltage of the actuator 85 flows to ground (GND) as actuator discharge current B.

However, in the conventional current amplification circuit using a bipolar transistor shown in FIG. 1, most of the power to drive the actuator is lost as heat from the bipolar transistor, resulting is wasted power consumption. Although many patent applications disclose configurations to recover the actuator discharge current B of actuator to reuse as the power to drive the actuator (actuator drive power), the recovered power amount is too small because the voltage that recovers the actuator discharge current is too low.

For example, JP-2002-273874-A discloses a configuration to reduce power consumption by effectively using electrical energy accumulated in an actuator, in which actuator discharge current is charged to a capacitor via a constant voltage circuit and the charge charged to the capacitor is reused as charging power for the ground side of the actuator.

However, because the potential at the ground side of the actuator does not change much, only a limited amount of the actuator discharge current can be recovered. Thus, most of the actuator discharge current is still consumed as heat loss from the transistor. Further, in view of a reverse voltage resistance of the transistor in a constant voltage circuit, the potential of capacitor used for charging needs to be set at 5V or so, and thereby most of the power cannot be recovered effectively.

SUMMARY

In one aspect of the present invention, a discharge energy recovery device to recover discharge energy discharged from a piezoelectric element when the piezoelectric element is driven is devised. The discharge energy recovery device includes a drive voltage generator to generate a voltage to drive the piezoelectric element; a discharge voltage monitoring unit to monitor a discharged voltage discharged from the piezoelectric element when the piezoelectric element is driven by the drive voltage generator; a first current supplier to supply a given current energy to operate a first load circuit when the discharged voltage is equal to or greater than a first voltage that enables driving of the first load circuit, by monitoring the currently discharged voltage using the discharge voltage monitoring unit; and a second current supplier to supply a given current energy to operate a second load circuit when the discharged voltage is less than the first voltage and equal to or greater than a second voltage that enables driving of the second load circuit by monitoring the currently discharged voltage using the discharge voltage monitoring unit, the given current energy to operate the first load circuit being different from the given current energy to operate the second load circuit.

In another aspect of the present invention, a discharge energy recovery device to recover discharge energy discharged from a piezoelectric element when the piezoelectric element is driven is devised. The discharge energy recovery device includes a drive voltage generator to generate a voltage to drive the piezoelectric element; a discharge voltage monitoring unit to monitor a discharged voltage discharged from the piezoelectric element when the piezoelectric element is driven by the drive voltage generator; and a current supplier to supply a given current energy to operate a load circuit by monitoring the currently discharged voltage using the discharge voltage monitoring unit.

BRIEF DESCRIPTION OF THE DRAWINGS

A more complete appreciation of the disclosure and many of the attendant advantages and features thereof can be readily obtained and understood from the following detailed description with reference to the accompanying drawings, wherein.

Figure 1:
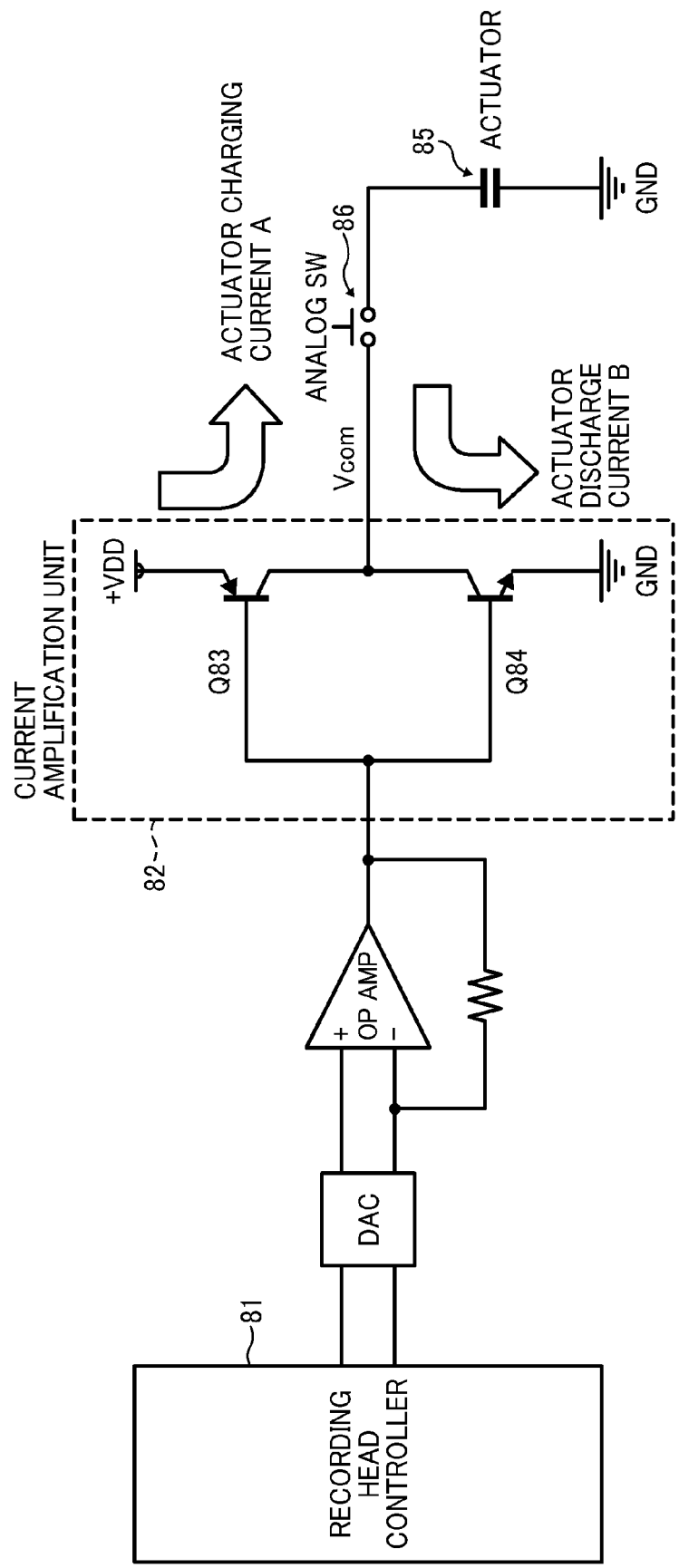
FIG. 1 shows a conventional circuit diagram of piezoelectric element drive circuit.

The accompanying drawings are intended to depict exemplary embodiments of the present invention and should not be interpreted to limit the scope thereof. The accompanying drawings are not to be considered as drawn to scale unless explicitly noted, and identical or similar reference numerals designate identical or similar components throughout the several views.

DETAILED DESCRIPTION OF EXEMPLARY EMBODIMENTS

A description is now given of exemplary embodiments of the present invention. It should be noted that although such terms as first, second, etc. may be used herein to describe various elements, components, regions, layers and/or sections, it should be understood that such elements, components, regions, layers and/or sections are not limited thereby because such terms are relative, that is, used only to distinguish one element, component, region, layer or section from another region, layer or section. Thus, for example, a first element, component, region, layer or section discussed below could be termed a second element, component, region, layer or section without departing from the teachings of the present invention. In addition, it should be noted that the terminology used herein is for the purpose of describing particular embodiments only and is not intended to be limiting of the present invention. Thus, for example, as used herein, the singular forms "a", "an" and "the" are intended to include the plural forms as well, unless the context clearly indicates otherwise. Moreover, the terms "includes" and/or "including", when used in this specification, specify the presence of stated features, integers, steps, operations, elements, and/or components, but do not preclude the presence or addition of one or more other features, integers, steps, operations, elements, components, and/or groups thereof. Furthermore, although in describing views shown in the drawings, specific terminology is employed for the sake of clarity, the present disclosure is not limited to the specific terminology so selected and it is to be understood that each specific element includes all technical equivalents that operate in a similar manner and achieve a similar result. Referring now to the drawings, an apparatus or system according to example embodiments is described hereinafter.

In the present invention, when the actuator discharge current is recovered, the recovered discharge current can be consumed or used as a power source of a controller which may need to use a great load and/or a power source of a drive system which may need to use a small load, wherein such power can be supplied via a constant voltage circuit.

Figure 2:
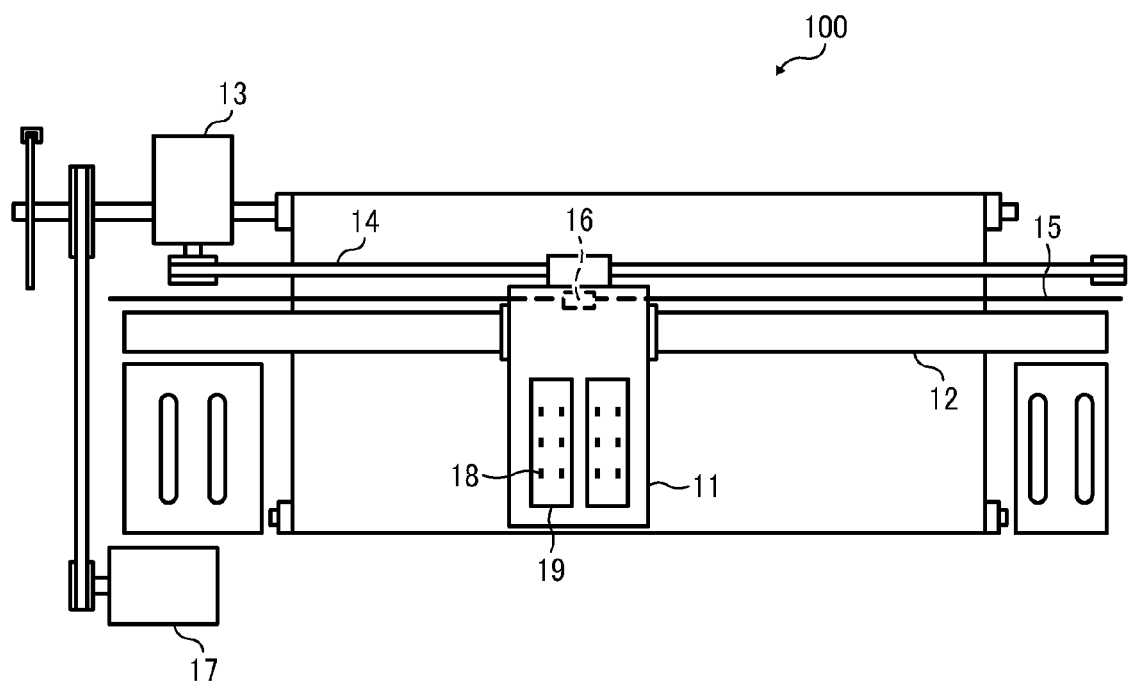
FIG. 2 shows a schematic configuration of an image forming apparatus according to an example embodiment.

FIG. 2 shows a basic configuration of an image forming apparatus 100 according to an example embodiment. In FIG. 2, a carriage 11 supported by a guide rod 12 can be scanned in a main scanning direction (left-to-right direction in FIG. 2) by a main scan motor 13 and a pulley 14. The carriage 11 includes a recording head 19 having ink nozzles 18 arranged in given directions to jet ink droplets of yellow (Y), cyan (C), magenta (M), and black (K).

By jetting ink droplets at given positions while moving the carriage 11 in the main scanning direction, an image can be formed on a recording medium. Positional information of the carriage 11 can be obtained using an encoder sheet 15 and an encoder sensor 16. The encoder sheet 15, fixed to a casing, having markings disposed with a same interval, and such markings are read by an encoder sensor 16 fixed on the carriage 11 while moving the carriage 11, and then the counted number of markings is added or deleted, by which the positional information of the carriage 11 can be obtained.

By conducting such carriage movement and ink jetting operation in the main scanning direction for one time, an image can be formed for one line with a width corresponding to a length of nozzle length in the sub-scanning direction. Upon forming one line image, a sub-scan motor 17 is driven to move the recording medium in the sub-scanning direction (up-to-bottom direction in FIG. 2), and then another one line image is formed similarly. By repeating such movement and ink jetting operation, an image can be formed on the recording medium.

Figure 3:
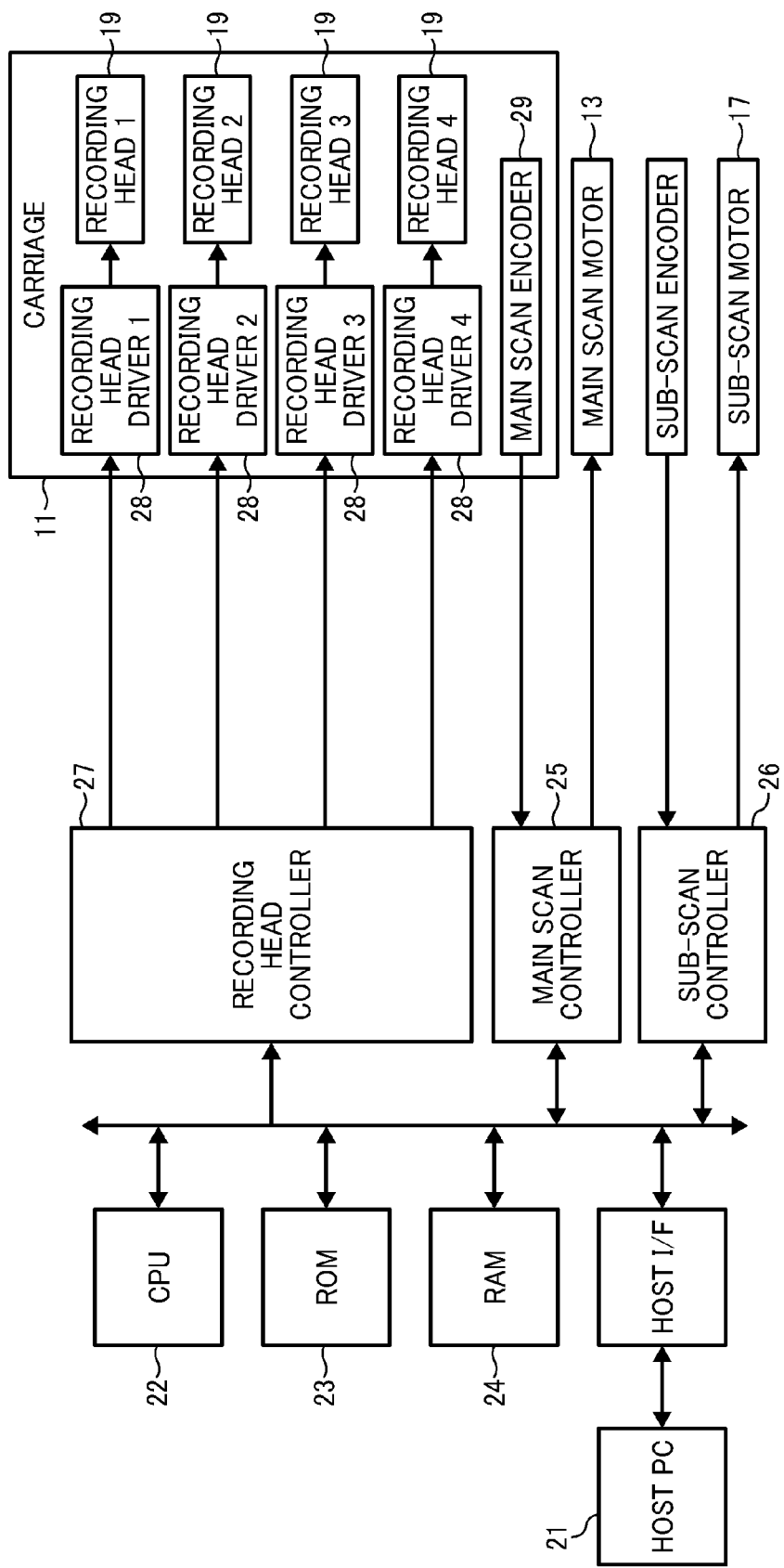
FIG. 3 shows a functional block diagram of an image forming apparatus according to an example embodiment.

A description is given of a functional block diagram of the image forming apparatus 100 according to an example embodiment with reference to FIG. 3. FIG. 3 shows a functional block diagram of the image forming apparatus 100. In such image forming apparatus 100, a firmware used for a hardware control and drive pattern data of the recording head 19 can be stored in a read only memory (ROM) 23. Upon receiving print jobs such as image data from a host personal computer (PC) 21, a central processing unit (CPU) 22 stores the image data in a random access memory (RAM) 24, and moves the carriage 11 having the recording head 19 at a given position on a recording medium using a main scan controller 25.

While in view of positional information of the carriage 11 obtainable from a main scan encoder 29, a recording head controller 27 transfers the image data stored in the RAM 24, the drive pattern data of the recording head 19 stored in the ROM 23, and control signals to a recording head drive unit 28. The recording head drive unit 28 drives the recording head 19 based on data transferred from the recording head controller 27 to jet ink droplets. The recording head controller 27 can be used as a control unit, which controls the process related to the present invention. The recording head controller 27 and other controllers, if any, can be configured using various types of processors, circuits, or the like such as a programmed processor, a circuit, an application specific integrated circuit (ASIC), used singly or in combination, and can be implemented in hardware or as a hardware/software combination.

Figure 4:
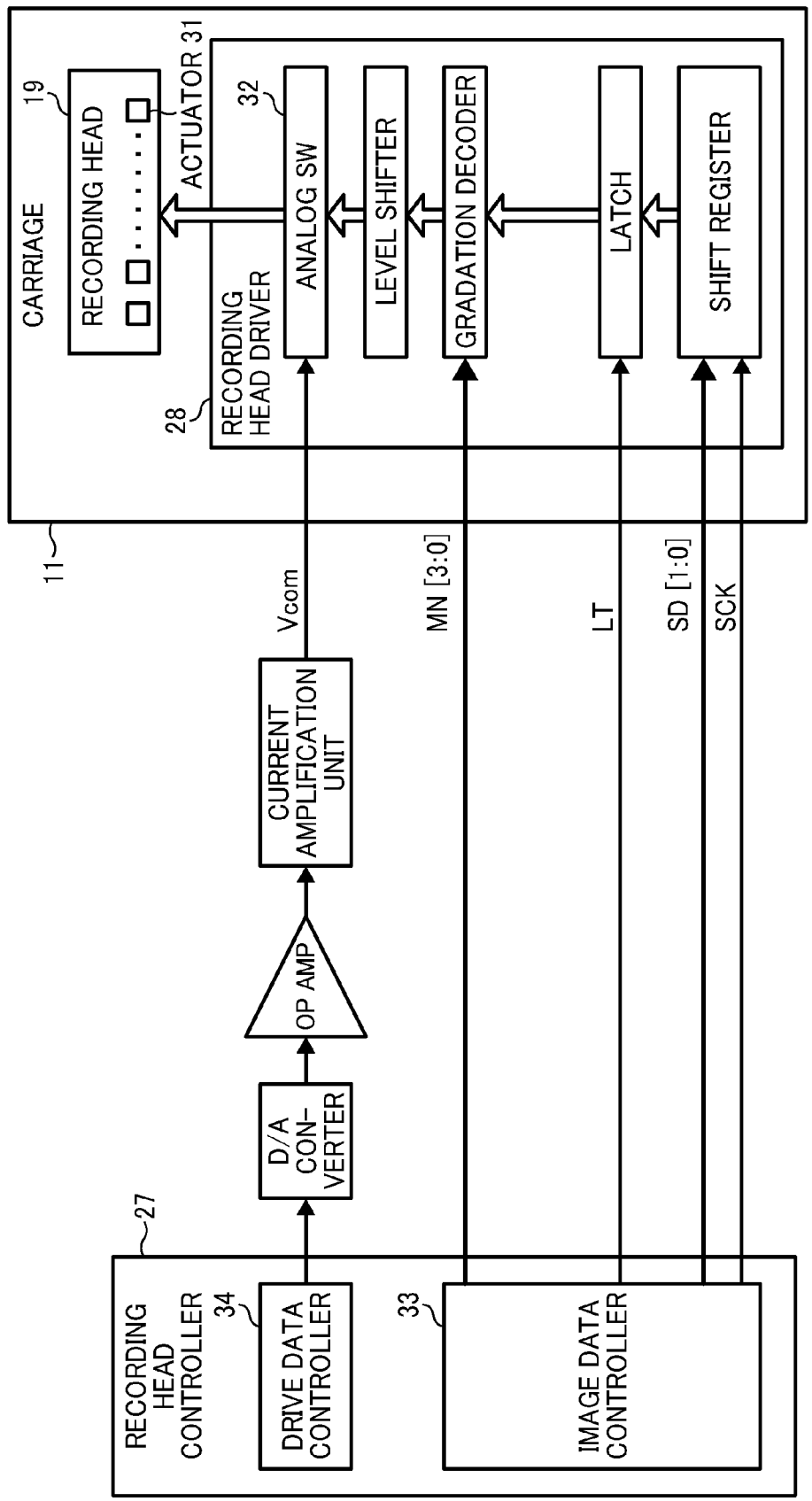
FIG. 4 shows a block diagram of a recording head control system of an image forming apparatus according to an example embodiment.

A description is given of the recording head controller 27 of the image forming apparatus 100 with reference to FIG. 4. FIG. 4 shows a block diagram of a recording head control of the image forming apparatus 100, in which one or more actuators 31 disposed in the recording head 19 are deformed to jet ink droplets. For the simplicity of expression, the one or more actuators 31 may be simply referred to as the actuator 31.

An application of charge voltage Vcom from the current amplification unit 42 to the actuator 31 is controlled by an ON/OFF control of an analog switch 32 to deform the actuator 31. The ON/OFF control of analog switch 32 is conducted based on information from the image data controller 33. The current amplification unit 42 includes base terminals of bipolar transistors Q43 and Q44 constitute a current amplification unit 42. The charge voltage Vcom for the actuator 31 is generated by conducting current amplification of +VDD1 based on information of a drive data controller 34 in the recording head controller 27. The drive data controller 34 controls drive pattern or waveform of actuator 31. In a configuration shown in FIG. 4, at least the drive data controller 34 in the recording head controller 27, a digital/analog converter, and an operational amplifier (OP AMP) can function as a drive voltage generator to generate a voltage to drive the actuator 31 such as a piezoelectric element or the like.

Figure 5:
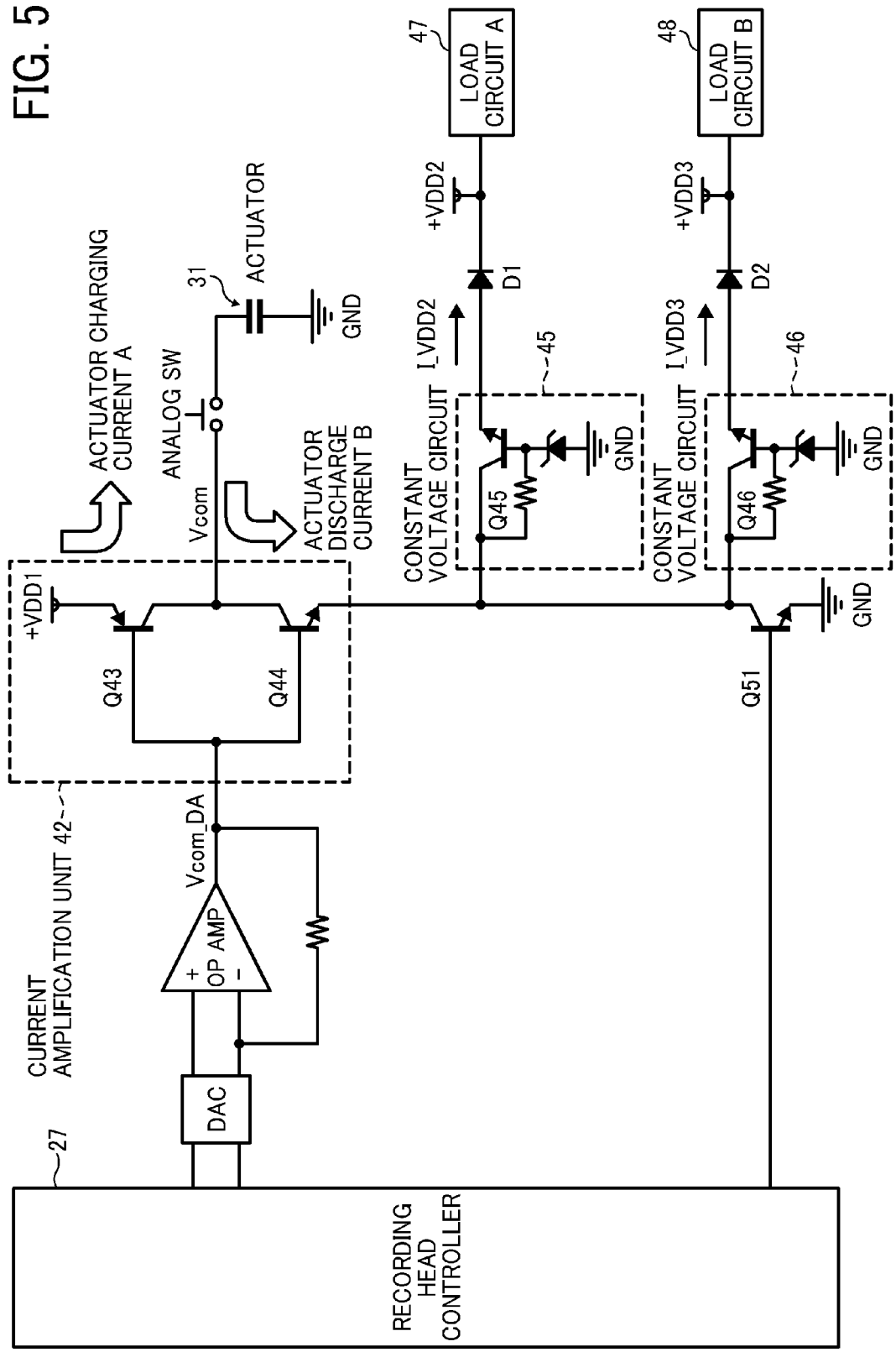
FIG. 5 shows a circuit diagram of a discharge energy recovery device according to an example embodiment.
Figure 6:
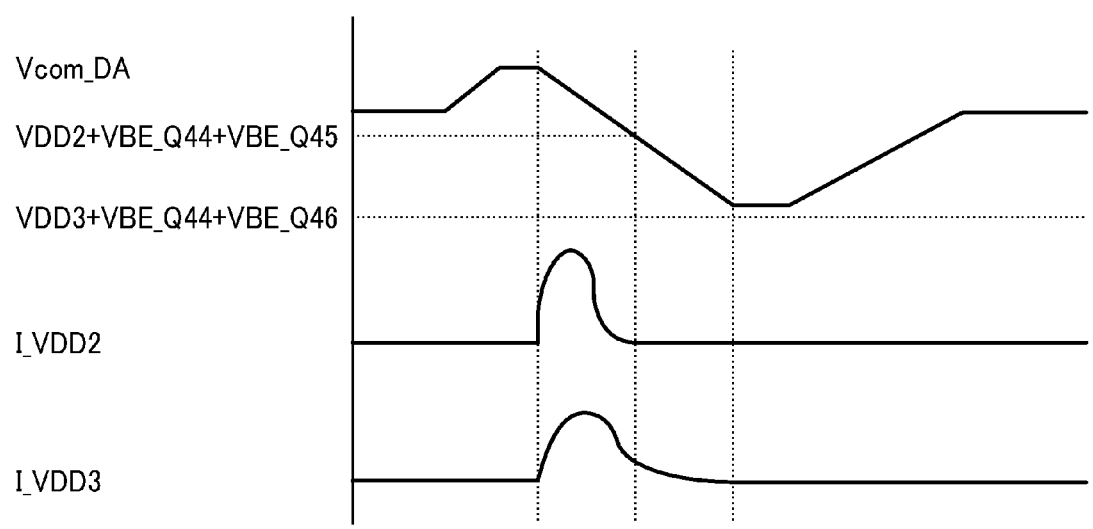
FIG. 6 shows an example of voltage/current pattern of a discharge energy recovery device according to an example embodiment.

A description is given of discharge energy recovery device and voltage/current pattern of the discharge energy recovery device according to an example embodiment with reference to FIGS. 5 and 6. FIG. 5 shows a circuit diagram of discharge energy recovery device, and FIG. 6 shows an example of voltage/current pattern of the discharge energy recovery device of FIG. 5. The voltage/current pattern may be also referred to a voltage/current waveform.

As shown in FIG. 5, a constant voltage circuit 45 includes, for example, a bipolar transistor Q45, a voltage regulator diode (Zener diode), and a resistor. The constant voltage circuit 45 is connected to a load circuit 47. The constant voltage circuit 45 is configured in a way so that an output voltage of constant voltage circuit 45 can be used as a power source voltage (+VDD2) of the load circuit 47 connected to the constant voltage circuit 45. The constant voltage circuit 45, which may be referred to as a first constant voltage circuit, can be used as a first current supplier to supply a given current energy to operate the load circuit 47 used as a first load circuit when the discharged voltage is equal to or greater than a first voltage that enables driving of the first load circuit by monitoring the currently discharged voltage using a discharge voltage monitoring unit, which is a function of the constant voltage circuit 45.

Similarly, a constant voltage circuit 46 includes a bipolar transistor Q46, for example, a voltage regulator diode (Zener diode), and a resistor. The constant voltage circuit 46 is connected to a load circuit 48. The constant voltage circuit 46 is configured to in a way so that an output voltage of constant voltage circuit 46 can be used as a power source voltage (+VDD3) of the load circuit 48 connected to the constant voltage circuit 46. In the configuration shown in FIG. 5, for example, the +VDD2 may be set higher than the +VDD3. The constant voltage circuit 46, which may be referred to as a second constant voltage circuit, can be used as a second current supplier to supply a given current energy to operate the load circuit 48 used as a second load circuit when the discharged voltage is less than the first voltage and equal to or greater than a second voltage that enables driving of the second load circuit by monitoring the currently discharged voltage using a discharge voltage monitoring unit, which is a function of the constant voltage circuit 46. The given current energy to operate the first load circuit may be different from the given current energy to operate the second load circuit. Although the configuration shown in FIG. 5 includes two constant voltage circuits and two corresponding load circuits, the number of the constant voltage circuits and corresponding load circuits is not limited to two (e.g., one, two, three, and so on can be set).

Further, a diode D1 is disposed between the constant voltage circuit 45, and the load circuit 47, and a diode D2 is disposed between the constant voltage circuit 46 and the load circuit 48. The diode D1 is disposed to prevent damages to the bipolar transistor Q45 of the constant voltage circuit 45 which may be caused by a reverse bias. As such, the diode D1 can be used as a first reverse current preventer. The diode D2 is disposed to prevent damages to the bipolar transistor Q46 of the constant voltage circuit 46 which may be caused by a reverse bias. As such, the diode D2 can be used as a second reverse current preventer. Each of the constant voltage circuit 45 and the constant voltage circuit 46 can be used as a discharge voltage monitoring unit to monitor a discharged voltage discharged from the piezoelectric element when the piezoelectric element is driven by the drive voltage generator. In a configuration of FIG. 5, by using the diode as a reverse current preventer, the current energy can be supplied to the load circuit without a control instruction from the recording head controller 27. Further, if the actuator discharge current B is not recovered, that is, if a voltage level of the actuator discharge current is less than the output voltage (+VDD3) of the constant voltage circuit 46, the actuator discharge current B is discharged to the GND via a bipolar transistor Q51.

A description is given of an example of voltage/current pattern of the discharge energy recovery device with reference to FIG. 6. When the actuator drive voltage Vcom_DA starts to decrease, that is, when the actuator 31 starts discharging, the actuator discharge current B (FIG. 5) can be supplied to as a power source (+VDD2) of the load circuit 47 and as a power source (+VDD3) of the load circuit 48 via the constant voltage circuit 45 and the constant voltage circuit 46, respectively.

In such a situation, a load current I_VDD2 corresponding to the power source (+VDD2) of the load circuit 47 is supplied, and a load current I_VDD3 corresponding to the power source (+VDD3) of the load circuit 48 is supplied. Hereinafter, the base(B)-emitter(E) voltage of each of the bipolar transistors Q44, Q45, and Q46 are respectively referred to VBE_Q44, VBE_Q45, and VBE_Q46.

When discharging of the actuator discharge current B (FIG. 5) starts, the actuator drive voltage Vcom_DA starts to decrease gradually. If the actuator drive voltage Vcom_DA is equal to or greater than "VDD2+VBE_Q44+VBE_Q45," the load current I_VDD2 (power supply to power source of +VDD2) is supplied to the load circuit 47. With such a configuration, the actuator discharge current B can be recovered efficiently while the actuator drive voltage Vcom_DA is at a high level.

When the actuator drive voltage Vcom_DA decreases furthermore, the load current I_VDD2 to the load circuit 47 decreases gradually while a supply of the load current I_VDD3 (power supply to power source of +VDD3) to the load circuit 48 is started.

Under a condition setting a minimum value of the actuator drive voltage equal to or less than "VDD3+VBE_Q44+VBE_Q46," when the actuator drive voltage Vcom_DA decreases furthermore, the supply of the load current I_VDD2 to the load circuit 47 is stopped until completing the discharging of the actuator discharge current B while the supply of the load current I_VDD3 to the load circuit 48 is continued (power supply to power source of +VDD3). With such a configuration, even if the actuator drive voltage Vcom_DA becomes a low level, the actuator discharge current B (FIG. 5) can be recovered efficiently, and thereby the wasteful usage of power can be reduced.

Figure 7:
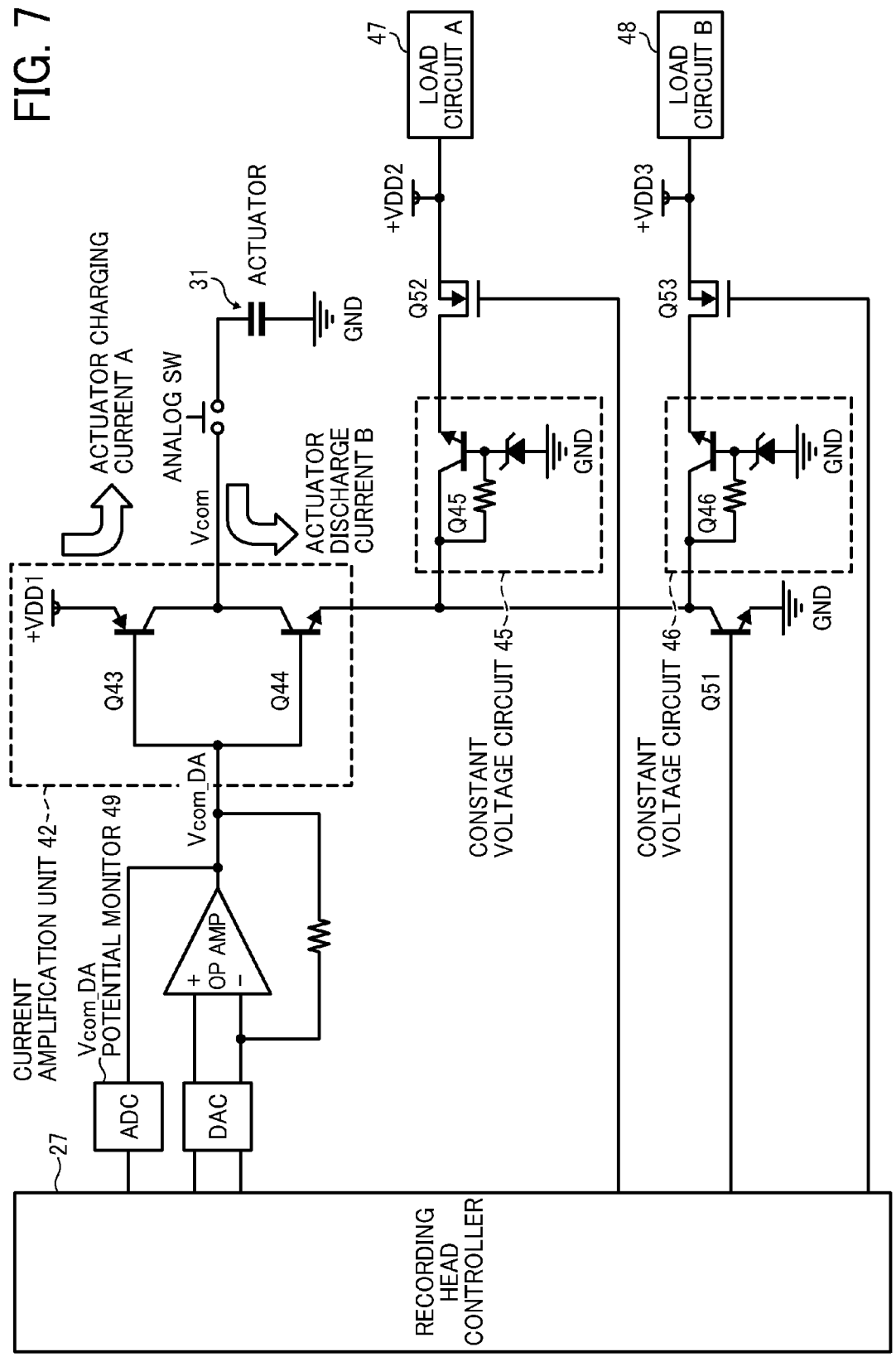
FIG. 7 shows a circuit diagram of a discharge energy recovery device according to another example embodiment.
Figure 8:
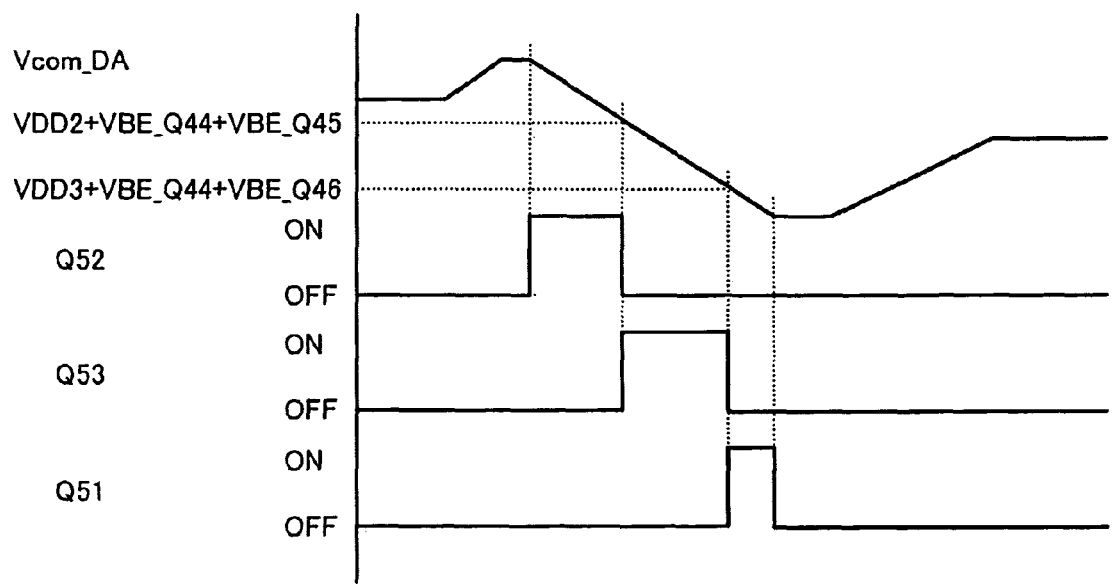
FIG. 8 shows an example of voltage pattern of a discharge energy recovery device according to another example embodiment.

A description is given of a discharge energy recovery device according to another example embodiment with reference to FIGS. 7 and 8. FIG. 7 shows a circuit diagram of discharge energy recovery device, and FIG. 8 shows an example of voltage pattern of the discharge energy recovery device.

As similar to the previous example corresponding to FIG. 5, the constant voltage circuit 45 includes the bipolar transistor Q45, the voltage regulator diode (Zener diode), and the resistor, and the constant voltage circuit 46 includes the bipolar transistor Q46, the voltage regulator diode (Zener diode) and the resistor as shown in FIG. 7. Further, the output voltage of constant voltage circuit 45 can be used as the power source voltage (+VDD2) of the load circuit 47 connected to the constant voltage circuit 45, and the output voltage of constant voltage circuit 46 can be used as the power source voltage (+VDD3) of the load circuit 48 connected to the constant voltage circuit 46. In a configuration of FIG. 7, the current energy can be supplied to the load circuit with a control instruction from the recording head controller 27. In another example embodiment corresponding to FIG. 7, a Vcom_DA potential monitor 49 (or analog/digital (A/D) converter) is disposed to monitor the voltage of the actuator drive voltage Vcom_DA. Further, a switching circuit Q52 is disposed between the constant voltage circuit 45 and the load current circuit 47, and a switching circuit Q53 is disposed between the constant voltage circuit 46 and the load current circuit 48, and a switching circuit Q51 is disposed as shown in FIG. 7. The switching circuits Q52, Q53, and Q51 can be used to switch a current supply such as to the load current circuits 47 or 48, and a discharging of the actuator discharge current B to the GND via a bipolar transistor of the switching circuit Q51 in view of the voltage level of the actuator drive voltage Vcom_DA. Each of the switching circuits Q52, Q53, and Q51 may employ a field effect transistor (FET) in a configuration of FIG. 7. The switching circuit Q52 can be used as a first switching unit controlled by a control signal from the recording head controller 27 to switch ON/OFF current energy supply from the constant voltage circuit 45 to the load circuit 47, and the switching circuit Q53 can be used as a second switching unit controlled by a control signal from the recording head controller 27 to switch ON/OFF current energy supply from the constant voltage circuit 46 to the load circuit 48.

As such, in view of the voltage of actuator drive voltage Vcom_DA, the ON/OFF switching control of the switching circuits Q52, Q53, and Q51 is controlled based on the control signal output from the recording head controller 27, by which the actuator discharge current can be supplied to the load current circuits 47 and 48 or can be discharged to the GND.

A description is given of an example of voltage pattern of the discharge energy recovery device with reference to FIG. 8. If the voltage value of actuator drive voltage Vcom_DA is equal to or greater than "VDD2+VBE_Q44+VBE_Q45," based on a control signal transmitted from the recording head controller 27, only the switching circuit Q52 is switched to the ON status, and the switching circuits Q53 and Q51 are switched to the OFF status, in which the actuator discharge current B can be recovered more when the actuator drive voltage Vcom_DA is still at a high level, and thereby the efficiency of power recovery can be enhanced.

Further, when the voltage value of actuator drive voltage Vcom_DA becomes equal to or less than "VDD2+VBE_Q44+VBE_Q45," based on a control signal transmitted from the recording head controller 27, the switching circuit Q52 is switched to the OFF status, and only the switching circuit Q53 is set to the ON status. With such a configuration, even if the actuator drive voltage Vcom_DA is at a low level, the actuator discharge current B can be recovered efficiently, and thereby the wasteful usage of power can be reduced.

Further, when the voltage value of actuator drive voltage Vcom_DA becomes equal to or less than "VDD2+VBE_Q44+VBE_Q46," based on a control signal transmitted from the recording head controller 27, the switching circuit Q53 is switched to the OFF status, and only the switching circuit 51 is switched to the ON status.

By switching only the switching circuit Q51 to the ON status, the actuator discharge current B can be discharged to the GND via the bipolar transistor of the switching circuit Q51. Therefore, even if the voltage value of actuator drive voltage Vcom_DA becomes equal to or less than "VDD3+VBE_Q44+VBE_Q46" (referred to as too-small voltage), the actuator drive voltage Vcom_DA can be applied to the actuator 31. As described above in the example embodiments, the actuator discharge current can be used or consumed as a power source of a load circuit such as a controller and a drive system via a constant voltage circuit, and thereby greater amount of the actuator discharge current can be recovered and used as effective power.

Further, a plurality of constant voltage circuits having different output voltages can be disposed as described above in the example embodiments. Therefore, when the actuator discharging voltage is at a high level, the actuator discharge current can be recovered at a high voltage level, and when the actuator discharging voltage is at a low level, the actuator discharge current can be recovered at a low voltage level. With such a configuration, the recovery efficiency of power can be enhanced.

As for the above-described example embodiments, without affecting to the actuator drive voltage pattern, a discharge energy recovery device can efficiently recover some of power used for driving an actuator and can reuse it as effective power, and an image forming apparatus employing such discharge energy recovery device can be devised. As for the above-described example embodiments, by recovering and reusing the actuator discharge current as effective power, the wasteful usage of power can be reduced significantly. The above-described discharge energy recovery devices can be applied to various electronic apparatuses including image forming apparatuses.

Numerous additional modifications and variations are possible in light of the above teachings. It is therefore to be understood that within the scope of the appended claims, the disclosure of the present invention may be practiced otherwise than as specifically described herein. For example, elements and/or features of different examples and illustrative embodiments may be combined each other and/or substituted for each other within the scope of this disclosure and appended claims.

What is claimed is:

1. A discharge energy recovery device to recover discharge energy discharged from a piezoelectric element when the piezoelectric element is driven, comprising:
   a drive voltage generator to generate a voltage to drive the piezoelectric element;
   a discharge voltage monitoring unit to monitor a discharged voltage discharged from the piezoelectric element when the piezoelectric element is driven by the drive voltage generator;
   a first current supplier to supply a given current energy to operate a first load circuit when the discharged voltage is equal to or greater than a first voltage that enables driving of the first load circuit by monitoring the currently discharged voltage using the discharge voltage monitoring unit; and
   a second current supplier to supply a given current energy to operate a second load circuit when the discharged voltage is less than the first voltage and equal to or greater than a second voltage that enables driving of the second load circuit by monitoring the currently discharged voltage using the discharge voltage monitoring unit, the given current energy to operate the first load circuit being different from the given current energy to operate the second load circuit.

2. The discharge energy recovery device of claim 1, further comprising a control unit, wherein the first current supplier includes a first constant voltage circuit to supply current energy to the first load circuit, and a first switching unit controlled by a control signal from the control unit to switch ON/OFF current energy supply from the first constant voltage circuit to the first load circuit.

3. The discharge energy recovery device of claim 2, wherein the second current supplier includes a second constant voltage circuit to supply current energy to the second load circuit, and a second switching unit controlled by a control signal from the control unit to switch ON/OFF current energy supply from the second constant voltage circuit to the second load circuit.

4. The discharge energy recovery device of claim 1, wherein the first current supplier includes a first constant voltage circuit and a first reverse current preventer, wherein the first load circuit prevents a reverse current flow from the first load circuit to the first constant voltage circuit, and the second current supplier includes a second constant voltage circuit and a second reverse current preventer, wherein the second load circuit prevents a reverse current flow from the second load circuit to the second constant voltage circuit.

5. The discharge energy recovery device of claim 4, wherein the first reverse current preventer is disposed between the first constant voltage circuit and the first load circuit to prevent the reverse current flow from the first load circuit to the first constant voltage circuit, wherein the second reverse current preventer is disposed between the second constant voltage circuit and the second load circuit to prevent the reverse current flow from the second load circuit to the second constant voltage circuit.

6. An image forming apparatus, comprising:
   an image forming unit to form an image on a recording medium; and
   the discharge energy recovery device of claim 1.

7. A discharge energy recovery device to recover discharge energy discharged from a piezoelectric element when the piezoelectric element is driven, comprising:
   a drive voltage generator to generate a voltage to drive the piezoelectric element;
   a discharge voltage monitoring unit to monitor a discharged voltage discharged from the piezoelectric element when the piezoelectric element is driven by the drive voltage generator; and
   a current supplier to supply current energy to operate a load circuit by monitoring the currently discharged voltage using the discharge voltage monitoring unit, wherein the current supplier includes a first current supplier to operate a first load circuit and a second current supplier to operate a second load circuit,
   wherein the first current supplier supplies a given current energy to operate the first load circuit when the discharged voltage is equal to or greater than a first voltage that enables driving of the first load circuit by monitoring the currently discharged voltage using the discharge voltage monitoring unit;
   wherein the second current supplier supplies a given current energy to operate a second load circuit when the discharged voltage is less than the first voltage and equal to or greater than a second voltage that enables driving of the second load circuit by monitoring the currently discharged voltage using the discharge voltage monitoring unit, the given current energy to operate the first load circuit being different from the given current energy to operate the second load circuit.

* * * * *